(12) United States Patent
Shin et al.

(10) Patent No.: US 11,094,538 B2
(45) Date of Patent: Aug. 17, 2021

(54) METHOD OF FORMING GRAPHENE

(71) Applicant: Samsung Electronics Co., Ltd., Suwon-si (KR)

(72) Inventors: Keunwook Shin, Yongin-si (KR); Changhyun Kim, Seoul (KR); Kaoru Yamamoto, Seongnam-si (KR); Changseok Lee, Seoul (KR); Hyunjae Song, Hwaseong-si (KR); Eunkyu Lee, Yongin-si (KR); Kyung-Eun Byun, Seongnam-si (KR); Hyeonjin Shin, Suwon-si (KR); Sungjoo An, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/260,403

(22) Filed: Jan. 29, 2019

(65) Prior Publication Data

US 2020/0105524 A1  Apr. 2, 2020

(30) Foreign Application Priority Data

Oct. 1, 2018 (KR) .................. 10-2018-0117101

(51) Int. Cl.
*H01L 21/02* (2006.01)
*H01L 29/16* (2006.01)

(52) U.S. Cl.
CPC .... *H01L 21/02527* (2013.01); *H01L 21/0262* (2013.01); *H01L 21/02658* (2013.01); *H01L 29/1606* (2013.01)

(58) Field of Classification Search
None
See application file for complete search history.

(56) References Cited

U.S. PATENT DOCUMENTS

| | | | |
|---|---|---|---|
| 7,988,941 B2 | 8/2011 | Choi et al. |
| 8,476,765 B2 | 7/2013 | Zhang et al. |
| 8,808,810 B2 | 8/2014 | Veerasamy |
| 9,306,005 B2 | 4/2016 | Byun et al. |
| 9,371,234 B2 | 6/2016 | Hong et al. |
| 9,472,450 B2 | 10/2016 | Bonilla et al. |
| 9,499,408 B2 | 11/2016 | Rieken |
| 9,543,156 B1 | 1/2017 | Hu |
| 10,738,377 B2 | 8/2020 | Matsumoto |

(Continued)

FOREIGN PATENT DOCUMENTS

| | | |
|---|---|---|
| CN | 103121670 A | 5/2013 |
| CN | 103572247 A | 2/2014 |

(Continued)

OTHER PUBLICATIONS

Notice of Allowance dated Dec. 9, 2020, received in corresponding U.S. Appl. No. 16/215,899.

(Continued)

*Primary Examiner* — Mounir S Amer
(74) *Attorney, Agent, or Firm* — Harness, Dickey & Pierce, P.L.C.

(57) ABSTRACT

Provided is a method of forming graphene. The method of forming graphene includes treating a surface of a substrate placed in a reaction chamber with plasma while applying a bias to the substrate, and growing graphene on the surface of the substrate by plasma enhanced chemical vapor deposition (PECVD).

24 Claims, 6 Drawing Sheets

(56) References Cited

U.S. PATENT DOCUMENTS

| | | | |
|---|---|---|---|
| 2004/0253167 A1* | 12/2004 | Silva | B82Y 40/00 |
| | | | 423/447.1 |
| 2007/0082488 A1 | 4/2007 | Katou | |
| 2011/0117328 A1 | 5/2011 | Ivanov | |
| 2011/0143045 A1 | 6/2011 | Veerasamy | |
| 2012/0021249 A1 | 1/2012 | Shin et al. | |
| 2012/0138903 A1 | 6/2012 | Chung et al. | |
| 2012/0139114 A1 | 6/2012 | Zhang et al. | |
| 2012/0141799 A1* | 6/2012 | Kub | H01L 31/072 |
| | | | 428/408 |
| 2012/0147147 A1 | 6/2012 | Park et al. | |
| 2012/0261644 A1 | 10/2012 | Dimitrakopoulos | |
| 2013/0001515 A1 | 1/2013 | Li et al. | |
| 2013/0130011 A1 | 5/2013 | Hong et al. | |
| 2013/0187097 A1 | 7/2013 | Hong et al. | |
| 2013/0299988 A1 | 11/2013 | Bonilla et al. | |
| 2013/0321584 A1 | 12/2013 | Choi | |
| 2014/0145332 A1 | 5/2014 | Ryan et al. | |
| 2014/0272195 A1 | 9/2014 | McAlister | |
| 2014/0353722 A1 | 12/2014 | Zhang et al. | |
| 2015/0013593 A1 | 1/2015 | Dong | |
| 2015/0235847 A1 | 8/2015 | Beasley et al. | |
| 2015/0235959 A1 | 8/2015 | Lee et al. | |
| 2016/0068397 A1 | 3/2016 | Su et al. | |
| 2016/0075560 A1 | 3/2016 | Kagaya et al. | |
| 2016/0240482 A1 | 8/2016 | Song et al. | |
| 2016/0270237 A1 | 9/2016 | Cho et al. | |
| 2016/0339160 A1 | 11/2016 | Bedworth et al. | |
| 2017/0033003 A1 | 2/2017 | Song et al. | |
| 2017/0154701 A1 | 6/2017 | Lee et al. | |
| 2018/0057933 A1 | 3/2018 | Ifuku et al. | |
| 2018/0149966 A1 | 5/2018 | Shin et al. | |
| 2018/0187298 A1 | 7/2018 | Matsumoto | |
| 2019/0096801 A1* | 3/2019 | Yang | H01L 21/76885 |
| 2019/0108948 A1 | 4/2019 | Chai et al. | |
| 2019/0144283 A1* | 5/2019 | Jakobsen | C23C 16/0272 |
| | | | 427/249.1 |
| 2019/0161351 A1 | 5/2019 | Song et al. | |
| 2019/0285548 A1 | 9/2019 | Nunney et al. | |
| 2020/0039827 A1 | 2/2020 | Jung et al. | |
| 2020/0071233 A1 | 3/2020 | Joo et al. | |
| 2020/0105524 A1 | 4/2020 | Shin et al. | |
| 2020/0140279 A1 | 5/2020 | Shin et al. | |
| 2020/0286732 A1 | 9/2020 | Shin et al. | |
| 2020/0350164 A1 | 11/2020 | Lee et al. | |
| 2020/0354829 A1 | 11/2020 | Song et al. | |

FOREIGN PATENT DOCUMENTS

| | | |
|---|---|---|
| CN | 103121670 B | 4/2015 |
| CN | 105585011 A | 5/2016 |
| JP | 2013249530 A | 12/2013 |
| JP | 2014170826 A | 9/2014 |
| KR | 20120012271 A | 2/2012 |
| KR | 20120059853 A | 6/2012 |
| KR | 101312454 B1 | 9/2013 |
| KR | 101313746 B1 | 10/2013 |
| KR | 2014-0005470 A | 1/2014 |
| KR | 101381008 B1 | 4/2014 |
| KR | 2014-0090333 A | 7/2014 |
| KR | 101493893 B1 | 2/2015 |
| KR | 20150012251 A | 2/2015 |
| KR | 2015-0082197 A | 7/2015 |
| KR | 20150098180 A | 8/2015 |
| KR | 2015-0116570 A | 10/2015 |
| KR | 20150121680 A | 10/2015 |
| KR | 2016-0059468 A | 5/2016 |
| KR | 20160085418 A | 7/2016 |
| KR | 20160112245 A | 9/2016 |
| KR | 20180025819 A | 3/2018 |
| WO | WO-2015022500 A1 | 2/2015 |
| WO | WO-2015149116 A1 | 10/2015 |

OTHER PUBLICATIONS

Extended European Search report dated Dec. 20, 2019, issued in corresponding European Patent Application No. 19171635.6.
Office Action dated Apr. 9, 2020, received in corresponding U.S. Appl. No. 16/215,899.
Office Action dated Sep. 21, 2020, received in corresponding U.S. Appl. No. 16/215,899.
Office Action dated Jul. 10, 2020, received in corresponding U.S. Appl. No. 16/884,590.
Office Action dated Nov. 3, 2020, received in corresponding U.S. Appl. No. 16/884,590.
Notice of Preliminary Examination Result dated Mar. 20, 2018, issued in corresponding Korean Patent Application No. KR 10-2017-0161833.
Menglin Li et al., 'Controllable Synthesis of Graphene by Plasma-Enhanced Chemical Vapor Deposition and Its Related Applications' *Advanced Science* 2016, 3, 1600003.
Yong Seung Kim, Direct Integration of Polycrystalline Graphene into Light Emitting Diodes by Plasma-Assisted Metal-Catalyst-Free Synthesis, ACS nano, vol. 8, No. 3, 2230-2236, 2014.
Office Action from the Korean Patent Office dated Jun. 11, 2018 for KR Appl. No. 10-2017-0161833.
European Search Report dated Mar. 29, 2019, issued in corresponding European Patent Application No. 18206535.9.
Wang et al., "Synthesis of graphene on a polycrystalline Co film by radio-freguency plasma-enhanced chemical vapour deposition" J.Phys. D:Appl.Phys. 43 (2010) 455402.
Liu et al., "Two-step growth of graphene with separate controlling nucleation and edge growth directly on $SiO_2$ substrates" Carbon 72 (2014) pp. 387-392.
Kim et al., "Direct growth of patterned graphene on $SiO_2$ substrates without the use of catalysts or lithography" Nanoscale (2014) 6, pp. 10100-10105.
"Graphene", Scientific Background on the Nobel Prize in Physics 2010, compiled by the Class for Physics of the Royal Swedish Academy of Sciences.
Richard J. Lewis, Sr., editor; Hawley's Condensed Chemical Dictionary; 12th edition; Van Nostrand Reinhold Company, New York; 1993; pp. 3, 25, 254, and 994-995.
Office Action dated Jul. 17, 2020, received in corresponding U.S. Appl. No. 16/244,906.
Extended European Search Report dated Jul. 31, 2019, issued in corresponding European Patent Application No. 18212973.4.
Extended European Search report dated Aug. 7, 2019, issued in corresponding European Patent Application No. 18206535.9.
Y. Wang et al., 'Toward High Throughput Interconvertible Graphane-to-Graphene Growth and Patterning'. *ACS Nano*, vol. 4, No. 10, 2010, pp. 6146-6152.
Z. Luo et al., 'Thickness-Dependent Reversible Hydrogenation of Graphene Layers'. *ACS Nano*, vol. 3, No. 7. 2009. pp. 1781-1788.
L. Pedrazzetti et al., 'Growth and characterization of ultrathin carbon films on electrodeposited Cu and Ni'. *Surface and interface Analysis*, vol. 49, 2017, pp. 1088-1094.
Office Action dated Jun. 11, 2020, received in corresponding U.S. Appl. No. 16/183,146.
Office Action dated Dec. 22, 2020, received in corresponding U.S. Appl. No. 16/183,146.
"Allotropes of Carbon", Introduction to Chemistry: nonmetallic elements; 10 pages; retrieved from the Internet Jan. 14, 2021 from ://courses.lumenlearning.com/introchem/chapter/allotropes-of-carbon/#:~:text = there are several allotropes of walled carbon nanotubes%2C or b . . . .
"6.3 Forms of Crystalline Carbon"; flex books 2.0, CK-12 Physical Science for Middle School; 7 pages; last modified Jul. 3, 2019, retrieved from the Internet Jan. 14, 2021 from ://flexbooks.CK12.org/cbook/CK-12-middle-school-physical-science-flex-book-2.0/section/6.3/primary/lesson/crystalline-carbon-ms-ps.
Office Action dated Feb. 1, 2021, received in corresponding U.S. Appl. No. 16/244,906.
Machine translation CN 103572247 A (published Feb. 12, 2014) via ESpaceNet.

\* cited by examiner

METHOD OF FORMING GRAPHENE

CROSS-REFERENCE TO RELATED APPLICATION

This application claims the benefit of Korean Patent Application No. 10-2018-0117101, filed on Oct. 1, 2018, in the Korean Intellectual Property Office, the disclosure of which is incorporated herein in its entirety by reference.

BACKGROUND

1. Field

The present disclosure relates to a method of forming graphene, and more particularly, to a method of directly forming graphene on a substrate.

2. Description of Related Art

In the field of semiconductor devices, studies on graphene have been actively conducted to address the increase of resistance caused by a decrease in the width of metal wiring and satisfy the necessity of new metal barrier material development. Graphene is a material having a hexagonal honeycomb structure formed by two-dimensionally connected carbon atoms, and the thickness of graphene is very small. Graphene may have an atom-size thickness. Such graphene may have high electrical mobility, satisfactory thermal characteristics, chemical stability, and a wide surface area compared to silicon (Si).

SUMMARY

Provided are methods of directly forming graphene on a substrate.

Additional aspects will be set forth in part in the description which follows and, in part, will be apparent from the description, or may be learned by practice of the presented embodiments.

According to an aspect of an embodiment, a method of forming graphene may include treating a surface of a substrate placed in a reaction chamber with plasma while applying a bias to the substrate, and growing graphene on the surface of the substrate by plasma enhanced chemical vapor deposition (PECVD).

In some embodiments, the treating the surface of the substrate may include forming at least one of charges and activation sites inducing adsorption of activated carbon on the surface of the substrate. The activation sites may include at least one of roughness and defects.

In some embodiments, the treating the surface of the substrate may include: injecting a pretreatment gas into the reaction chamber; applying the bias to the substrate; and generating the plasma in the reaction chamber while applying the bias to the substrate.

In some embodiments, the pretreatment gas may include at least one of an inert gas, hydrogen, oxygen, ammonia, chlorine, bromine, fluorine, and fluorocarbon.

In some embodiments, the applying bias to the substrate may include supplying a bias power to the substrate. The bias power may range from about 1 W to about 100 W.

In some embodiments, the growing the graphene may include: injecting a reaction gas including a carbon source into the reaction chamber; and directly growing the graphene on the surface of the substrate by generating plasma in the reaction chamber.

In some embodiments, the reaction gas may further include at least one of an inert gas and hydrogen gas.

In some embodiments, the treating the surface of the substrate and the growing the graphene may be performed at a processing temperature of about 1000° C. or less.

In some embodiments, the treating the surface of the substrate may be performed at a lower processing pressure than the growing the graphene. The treating the surface of the substrate may be performed at a processing pressure of about 0.02 torr to about 5.0 torr.

In some embodiments, the plasma used in the treating the surface of the substrate may be generated by at least one a radio frequency (RF) plasma generating device or a microwave (MW) plasma generating device. The plasma used in the growing the graphene may be generated by at least one a radio frequency (RF) plasma generating device or a microwave (MW) plasma generating device.

In some embodiments, a plasma power in the treating the surface of the substrate may be greater than a plasma power in the growing the graphene. A plasma power in the treating the surface of the substrate may range from about 10 W to about 4000 W.

In some embodiments, the growing the graphene further may include applying a bias to the substrate.

In some embodiments, the substrate may include at least one of a group IV semiconductor material, a semiconductor compound, a metal, and an insulating material. The substrate may further include a dopant.

According to an aspect of another embodiment, a method of forming graphene may include: treating a surface of a substrate by applying a bias to the substrate; and growing graphene on the surface of the substrate.

In some embodiments, the treating the surface of the substrate may include: injecting a pretreatment gas into a reaction chamber; applying the bias to the substrate; and generating plasma in the reaction chamber while applying the bias to the substrate.

In some embodiments, the growing the graphene may include: injecting a reaction gas including a carbon source into a reaction chamber; and directly growing the graphene on the surface of the substrate by generating plasma in the reaction chamber.

According to an aspect of another embodiment, a method of forming graphene may include: preparing a substrate including a plasma-treated surface and growing graphene on the plasma-treated surface of the substrate by plasma enhanced chemical vapor deposition (PECVD). The preparing the substrate may include performing a plasma operation on the substrate while applying a bias to the substrate.

In some embodiments, the preparing the substrate may include placing the substrate including the plasma-treated surface in a reaction chamber, injecting a pretreatment gas into the reaction chamber, applying the bias to the substrate, and generating a plasma in the reaction chamber while applying the bias to the substrate in the reaction chamber.

In some embodiments, the pretreatment gas may include at least one of an of an inert gas, hydrogen, oxygen, ammonia, chlorine, bromine, fluorine, and fluorocarbon. The substrate may include at least one of a group IV semiconductor material, a semiconductor compound, a metal, and an insulating material.

In some embodiments, the preparing the substrate may be performed at a processing temperature of about 1000° C. or less, a processing pressure in a range of about 0.02 torr to about 5.00 torr, a bias power in a range from about 1 W to about 100 W, and a plasma power in range from about 10 W to about 4000 W.

In some embodiments, the growing graphene on the plasma-treated surface of the substrate may include injecting a reaction gas including a carbon source into a reaction chamber, and generating a plasma in the reaction chamber from the reaction gas while the substrate including the plasma-treated surface is in the reaction chamber.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Figure 1:
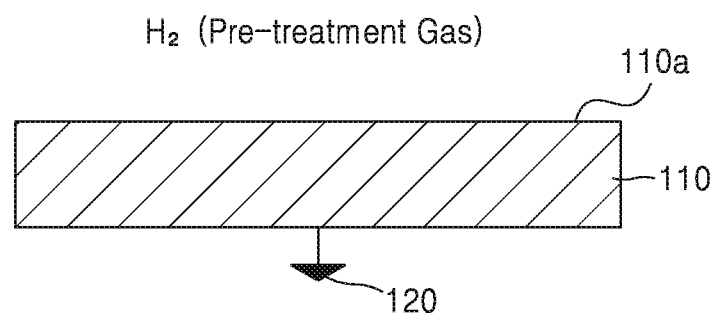
FIGS. 1 to 8 are views illustrating a method of forming graphene according to an example embodiment.

Reference will now be made in detail to embodiments, examples of which are illustrated in the accompanying drawings. In the drawings, like reference numerals refer to like elements, and the sizes of elements may be exaggerated for clarity of illustration. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements (e.g., A, B, and C), modify the entire list of elements and do not modify the individual elements of the list. For example, "at least one of A, B, and C," and "at least one of A, B, or C" may be construed as covering any one of the following combinations: A; B; A and B; A and C; B and C; and A, B, and C."

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in appropriate order unless explicitly described in terms of order or described to the contrary. That is, operations are not limited to the order in which the operations are described. Examples or exemplary terms are just used herein to describe technical ideas and should not be considered for purposes of limitation unless defined by the claims.

Graphene is a material having a hexagonal honeycomb structure formed by two-dimensionally connected carbon atoms, and the thickness of graphene is very small, that is, graphene has an atom-size thickness. Such graphene has high electrical mobility, satisfactory thermal characteristics, chemical stability, and a wide surface area compared to silicon (Si). In the following embodiments, a method of forming graphene will be described.

FIGS. 1 to 8 are views illustrating a method of forming graphene according to an example embodiment that includes a substrate pretreatment process and a graphene growth process. FIGS. 1 to 4B are views illustrating the substrate pretreatment process, and FIGS. 5 to 8 are views illustrating the graphene growth process.

Hereinafter, the substrate pretreatment process will be first described with reference to FIGS. 1 to 4B.

Referring to FIG. 1, a pretreatment gas is injected into a reaction chamber (not shown) in which a substrate 110 is provided.

For example, the substrate 110 may include a semiconductor material. The semiconductor material may include, for example, a group IV semiconductor material or a semiconductor compound. For example, the group IV semiconductor material may include silicon (Si), germanium (Ge), or tin (Sn). In addition, for example, the semiconductor compound may include a material in which at least two of silicon (Si), germanium (Ge), carbon (C), zinc (Zn), cadmium (Cd), aluminum (Al), gallium (Ga), indium (In), boron (B), nitrogen (N), phosphorus (P), sulfur (S), selenium (Se), arsenic (As), antimony (Sb), and tellurium (Te) are combined with each other.

The substrate 110 may include a metal. For example, the metal may include at least one of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), and gadolinium (Gd). In addition, the substrate 110 may include an insulating material. The insulating material may include, for example, an oxide, a nitride, a carbide, or the like. The above-mentioned materials of the substrate 110 are merely examples, and the substrate 110 may include various other materials. In addition, the substrate 110 may further include a dopant. The substrate 110 may include a surface 110a.

For example, the pretreatment gas injected into the reaction chamber in the substrate pretreatment process may include at least one of an inert gas, hydrogen, oxygen, ammonia, chlorine, bromine, fluorine, and fluorocarbon. For example, the inert gas may include at least one of argon gas, neon gas, nitrogen gas, helium gas, krypton gas, and xenon gas. FIG. 1 shows an example in which hydrogen is used as the pretreatment gas.

Next, a bias is applied to the substrate 110 using a bias supply 120. The bias applied to the substrate 110 may be, for example, a radio frequency (RF) bias or a direct current (DC) bias. Accordingly, a positive (+) bias voltage or a negative (−) bias voltage may be applied to the substrate 110. To this end, bias power having a given value may be applied to the substrate 110. For example, the bias power applied to the substrate 110 in the substrate pretreatment process may range from about 1 W to about 100 W. However, this is merely an example, and the bias power applied to the substrate 110 may be diversely varied.

Figure 2:
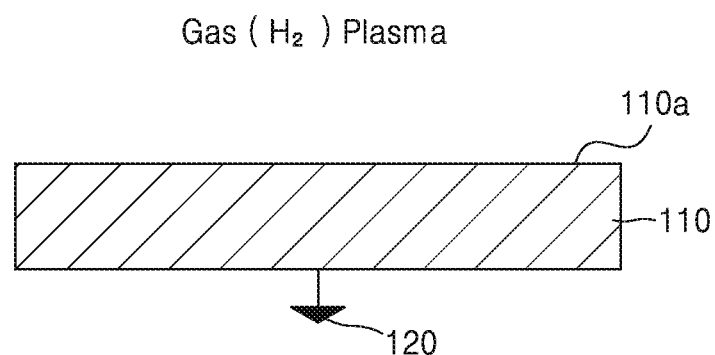

Referring to FIG. 2, in a state in which the bias is applied to the substrate 110, power for generating plasma is applied to the inside of the reaction chamber from a plasma power source (not shown). The plasma power applied in the substrate pretreatment process may be greater than plasma power applied in the graphene growth process described later. However, this is a non-limiting example, and the plasma power applied in the substrate pretreatment process may be variously varied according to growth conditions of graphene. For example, the plasma power applied in the substrate pretreatment process may range from about 10 W to about 4000 W.

For example, the plasma power supply may be an RF plasma generating device or a microwave (MW) plasma generating device. The RF plasma generating device may generate RF plasma, for example, within a frequency range of about 3 MHz to about 100 MHz, and the MW plasma generating device may generate MW plasma, for example, within a frequency range of about 0.7 GHz to about 2.5 GHz. However, these frequency ranges are merely examples. That is, other frequency ranges may be used. Alternatively, the plasma power supply may include a plurality of RF plasma generating devices or a plurality of MW plasma generating devices.

Figure 3:
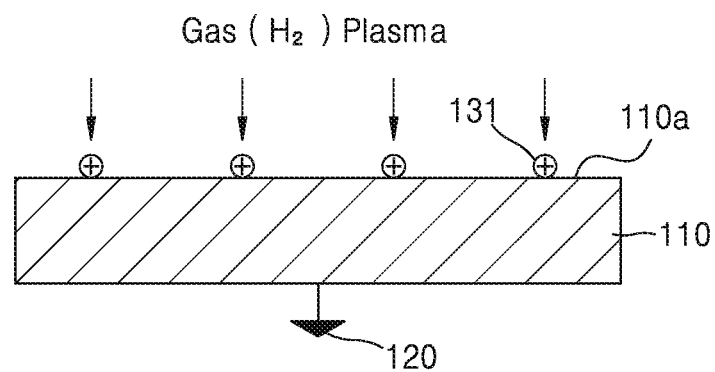

Referring to FIG. 3, when plasma power is applied to the inside of the reaction chamber in a state in which a bias is applied to the substrate 110, gas plasma (for example, hydrogen plasma) may be generated in the reaction chamber. As described above, when gas plasma is generated in the reaction chamber in a state in which a bias applied to the substrate 110, charges 131 may be formed on the surface 110a of the substrate 110. For example, positive (+) charges 131 may be formed on the surface 110a of the substrate 110 as shown in FIG. 3 when a negative (−) bias voltage is applied to the substrate 110. Alternatively, negative (−) charges may be formed on the surface 110a of the substrate 110 when a positive (+) bias voltage is applied to the substrate 110.

The charges 131 formed on the surface 110a of the substrate 110 by applying plasma power in a state in which a bias is applied to the substrate 110 may induce adsorption of activated carbon 140 (refer to FIG. 7) in the graphene growth process described later.

When gas plasma is generated by applying plasma power in a state in which a bias is applied to the substrate 110, activation sites 132 (refer to FIG. 4A) capable of inducing adsorption of activated carbon 140 (refer to FIG. 7) may be formed on the surface 110a of the substrate 110.

Figure 4A:
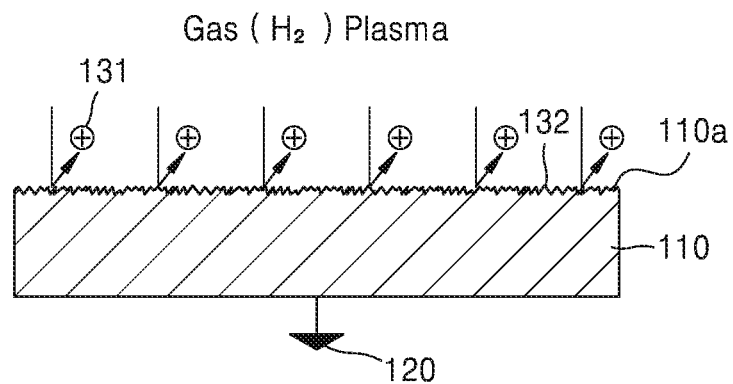

FIG. 4A shows the activation sites 132 formed on the surface 110a of the substrate 110 by applying plasma power in a state in which a bias is applied to the substrate 110. Referring to FIG. 4A, when plasma is generated by applying plasma power in a state in which a bias is applied to the substrate 110, charges 131 may move toward the substrate 110 and may collide with the surface 110a of the substrate 110 in the reaction chamber. Accordingly, the activation sites 132 may be formed on the surface 110a of the substrate 110, and the activation sites 132 may induce adsorption of activated carbon 140 (refer to FIG. 7) in the graphene growth process described later. Here, the activation sites 132 may include, for example, roughness or defects. FIG. 4A illustrates roughness as an example of the activation sites 132.

When gas plasma is generated by applying plasma power in a state in which a bias is applied to the substrate 110, charges 131 and activation sites 132 capable of inducing adsorption of activated carbon 140 (refer to FIG. 7) may all be formed on the surface 110a of the substrate 110.

Figure 4B:
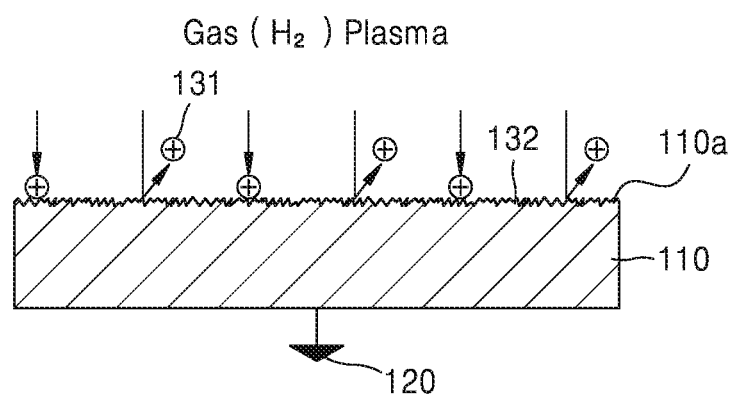

FIG. 4B illustrates charges 131 and activation sites 132 formed on the surface 110a of the substrate 110 by applying plasma power in a state in which a bias is applied to the substrate 110. Referring to FIG. 4B, when plasma is generated by applying plasma power in a state in which a bias is applied to the substrate 110, charges 131 may move toward the substrate 110 in the reaction chamber. In this process, some of the charges 131 may be formed on the surface 110a of the substrate 110, and the other of the charges 131 may collide with the surface 110a of the substrate 110 and may form the activation sites 132. Here, the activation sites 132 may include, for example, roughness or defects.

In the substrate pretreatment process, the processing temperature and the processing pressure of the inside of the reaction chamber may be varied diversely according to growth conditions of graphene. For example, the substrate pretreatment process may be performed at a relatively low temperature. For example, the substrate pretreatment process may be performed at a processing temperature of about 1000° C. or less. For example, the substrate pretreatment process may be performed at a processing temperature of about 700° C. or less (for example, about 400° C. or less).

In addition, for example, the processing pressure at which the substrate pretreatment process is performed may be less than the processing pressure at which the graphene growth process (described later) is performed. However, this is a non-limiting example. That is, the processing pressure at which the substrate pretreatment process is performed may be variously varied according to growth conditions of graphene. For example, the processing pressure at which the substrate pretreatment process is performed may range from about 0.02 torr to about 5.0 torr.

At least one of the charges 131 and the activation sites 132 capable of inducing adsorption of activated carbon 140 (refer to FIG. 7) may be formed on the surface 110a of the substrate 110 through the above-described substrate pretreatment process. Owing to the charges 131 or the activation sites 132 formed on the surface 110a of the substrate 110, activated carbon 140 (refer to FIG. 7) may be effectively adsorbed on the surface 110a of the substrate 110 in the graphene growth process (described later), and thus graphene 150 (refer to FIG. 8) may be directly grown and formed on the surface 110a of the substrate 110 at a relatively low temperature of about 700° C. or less.

Hereinafter, a process of growing graphene 150 (refer to FIG. 8) on the surface 110a of the substrate 110 on which the substrate pretreatment process has been performed as described above will be described with reference to FIGS. 5 to 8. As described above, at least one of the charges 131 and the activation sites 132 capable of inducing adsorption of activated carbon 140 (refer to FIG. 7) may be formed on the surface 110a of the substrate 110 through the above-described substrate pretreatment process. In FIGS. 5 to 8, the charges 131 and the activation sites 132 formed on the surface 110a of the substrate 110 through the substrate pretreatment process are not shown for convenience sake.

FIGS. 5 to 8 illustrate operations for growing graphene 150 on the surface 110a of the substrate 110 by plasma enhanced chemical vapor deposition (PECVD).

Figure 5:
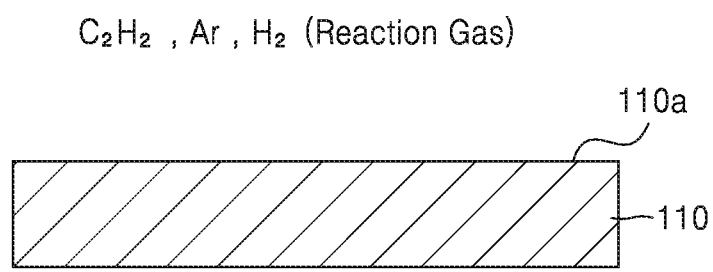

Referring to FIG. 5, after the substrate pretreatment process, reaction gas for growing graphene 150 is injected into the reaction chamber. Here, the reaction gas may include a carbon source. Here, the carbon source may be a source for supplying carbon for growing the graphene 150.

For example, the carbon source may include at least one of hydrocarbon gas and vapor of a liquid precursor containing carbon. For example, the hydrocarbon gas may include methane gas, ethylene gas, acetylene gas, or propylene gas, a sub-combination thereof, or a combination thereof. In addition, the liquid precursor containing carbon may include, for example, benzene, toluene, xylene, anisole, hexane, octane, isopropyl alcohol, ethanol, a sub-combination thereof, or a combination thereof, or the like. However, the carbon source materials mentioned above are merely examples. That is, various other materials may be used as the carbon source.

The reaction gas may further include at least one of an inert gas and hydrogen gas. For example, the inert gas may include at least one of argon gas, neon gas, nitrogen gas, helium gas, krypton gas, and xenon gas. FIG. 5 illustrates an example in which the reaction gas includes a carbon source, an inert gas, and hydrogen gas, wherein acetylene gas and argon gas are respectively used as the carbon source the inert gas. Meanwhile, the mixing ratio of the reaction gas injected into the reaction chamber may be diversely varied according to growth conditions of the graphene 150.

Figure 6:
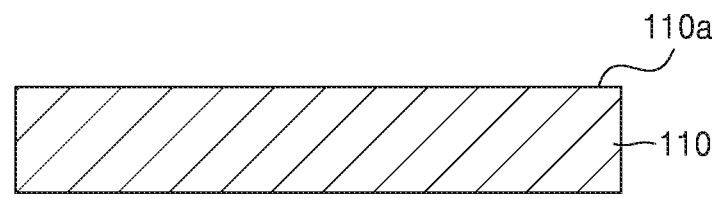

Referring to FIG. 6, power for generating plasma inside the reaction chamber is applied from a plasma power supply (not shown). The plasma power applied in the graphene growth process may be less than the plasma power applied in the substrate pretreatment process. However, this is a non-limiting example, and the plasma power applied in the graphene growth process may be diversely varied according to growth conditions of the graphene 150.

For example, the plasma power supply may be an RF plasma generating device or an MW plasma generating device. The RF plasma generating device may generate RF plasma, for example, within a frequency range of about 3 MHz to about 100 MHz, and the MW plasma generating device may generate MW plasma, for example, within a frequency range of about 0.7 GHz to about 2.5 GHz. However, these frequency ranges are merely examples. That is, other frequency ranges may be used. Alternatively, the plasma power supply may include a plurality of RF plasma generating devices or a plurality of MW plasma generating devices.

When power for generating plasma inside the reaction chamber is applied from the plasma power supply, plasma of the reaction gas may be generated in the reaction chamber. In addition, activated carbon 140 (refer to FIG. 7), for example, activated carbon source radicals, may be formed in the reaction chamber by the plasma of the reaction gas.

Figure 7:
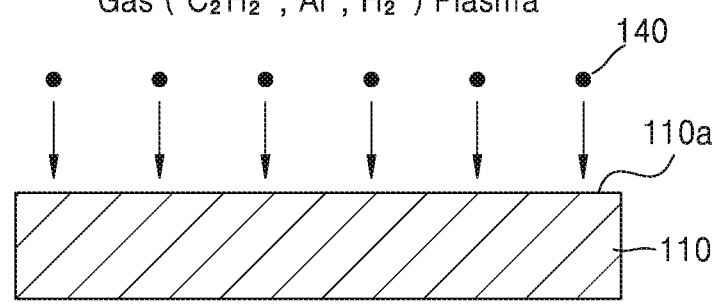

Referring to FIG. 7, carbon 140 activated by the plasma of the reaction gas, that is, carbon source radicals, is adsorbed on the surface 110*a* of the substrate 110. Here, as described above, since at least one of the charges 131 (refer to FIG. 3) and the activation sites 132 (refer to FIG. 4A) capable of inducing adsorption of the activated carbon 140 are formed on the surface 110*a* of the substrate 110 through the substrate pretreatment process, the activated carbon 140 may be more effectively adsorbed on the surface 110*a* of the substrate 110 owing to the charges 131 and the activation sites 132.

Figure 8:
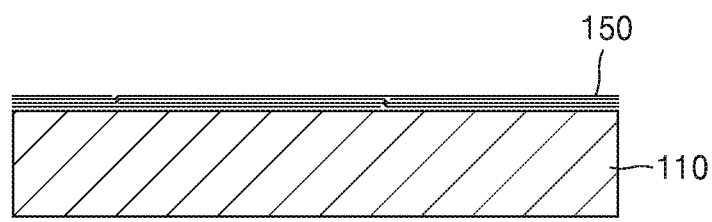

Referring to FIG. 8, as described above, as the activated carbon 140 is continuously adsorbed on the surface 110*a* of the substrate 110, graphene 150 may be grown and formed on the surface 110*a* of the substrate 110. In this case, carbides may be formed on the surface 110*a* of the substrate 110 that is in contact with the graphene 150 because carbon combines with a substrate material.

In the graphene growth process, the processing temperature and the processing pressure of the inside of the reaction chamber may be diversely varied according to growth conditions of graphene. For example, the graphene growth process may be performed at a relatively low temperature like the substrate pretreatment process. For example, the graphene growth process may be performed at a processing temperature of about 1000° C. or less. For example, the graphene growth process may be performed at a processing temperature of about 700° C. or less.

The processing pressure at which the graphene growth process is performed may be greater than the processing pressure of the above-described substrate pretreatment process. However, this is a non-limiting example. That is, the processing pressure at which the graphene growth process is performed may be diversely varied according to growth conditions of graphene.

As described above, in the substrate pretreatment process, a bias is applied to the substrate 110, and plasma is generated such that charges 131 or activation sites 132 capable of inducing adsorption of activated carbon 140 may be formed on the surface 110*a* of the substrate 110. Therefore, owing to the charges 131 or the activation sites 132, activated carbon 140 may be more effectively adsorbed on the surface 110*a* of the substrate 110 in the graphene growth process. Therefore, the graphene 150 may be directly grown on the surface 110*a* of the substrate 110 at a relatively low temperature.

For example, when a semiconductor device including graphene that may be used as a metal barrier material is fabricated, it may be necessary to directly grow graphene on a non-catalytic substrate at a relatively low temperature of about 700° C. or less. According to the example embodiment, the substrate pretreatment process may be performed at a relatively low temperature to induce adsorption of activated carbon 140 on the surface 110*a* of the substrate 110, and graphene 150 may be directly grown and formed on the pretreated surface 110*a* of the substrate 110 by PECVD. Therefore, a semiconductor device including graphene may be easily fabricated through low-temperature processes.

Figure 9:
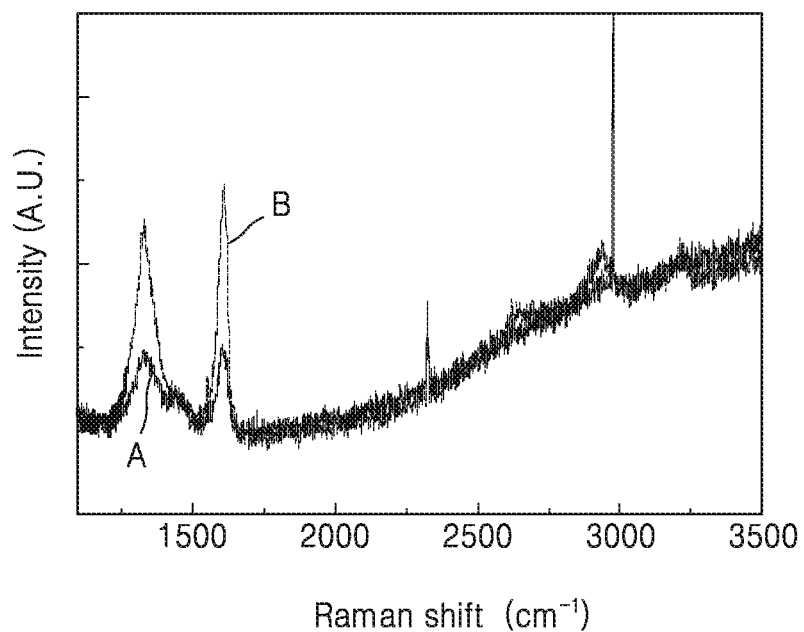
FIG. 9 is a view illustrating Raman spectra measured from surfaces of silicon substrates after graphene was grown on the surfaces of the silicon substrates according to a first method (a process that includes applying a bias to a silicon substrate in a pretreatment process of the silicon substrate) and a second method (a process that does not include applying a bias to a silicon substrate in a pretreatment process of the silicon substrate)

FIG. 9 illustrates Raman spectra measured from surfaces of silicon substrates after graphene was grown on the surfaces of the silicon substrates according to a first method (a process that includes applying a bias to a silicon substrate in a pretreatment process of the silicon substrate (curve B)) and a second method (a process that does not include applying a bias to a silicon substrate in a pretreatment process of the silicon substrate (curve A)). FIG. 9 illustrates results when bias power of 25 W was applied to the silicon substrate for 5 minutes.

Referring to FIG. 9, Raman peaks were greater when a bias was applied to the silicon substrate in the pretreatment process of the silicon substrate (curve B) than when a bias was not applied to the silicon substrate in the pretreatment process of the silicon substrate (curve A). Therefore, it could be understood that it is possible to directly grow graphene on a surface of a silicon substrate even at a relatively low temperature of about 700° C. or less by applying a bias to the silicon substrate in a pretreatment process of the silicon substrate.

Figure 10:
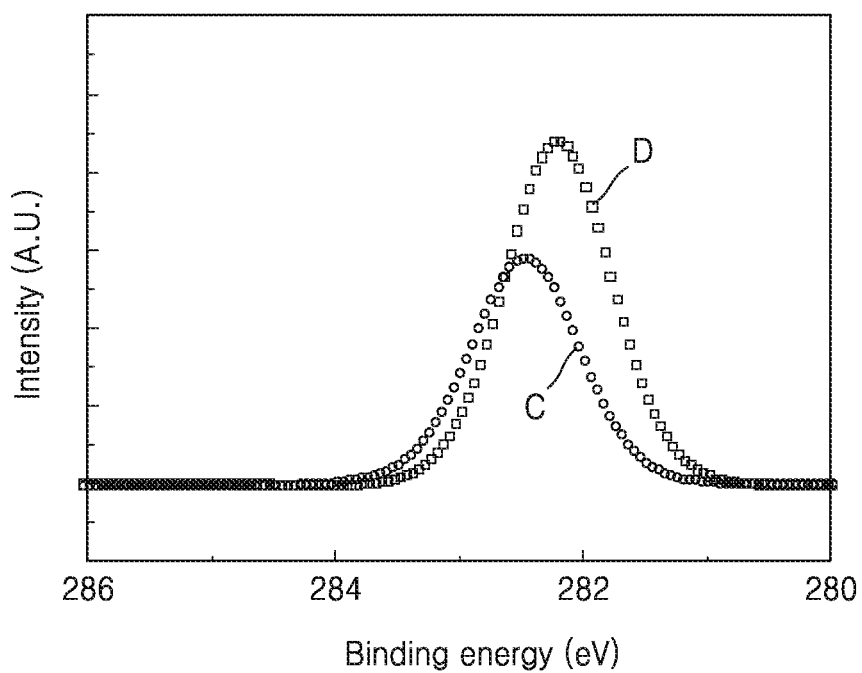
FIG. 10 is a view illustrating the amounts of Si—C bonds formed on surfaces of silicon substrates after graphene was grown on the surfaces of the silicon substrates according to a first method (a process that includes applying a bias to a silicon substrate in a pretreatment process of the silicon substrate) and a second method (a process that does not include applying a bias to a silicon substrate in a pretreatment process of the silicon substrate)

FIG. 10 illustrates the amounts of Si—C bonds formed on surfaces of silicon substrates after graphene was grown on the surfaces of the silicon substrates according to a first method (a process that includes applying a bias to a silicon substrate in a pretreatment process of the silicon substrate (curve D)) and a second method (a process that does not include applying a bias to a silicon substrate in a pretreatment process of the silicon substrate (curve C)). FIG. 10 illustrates results when bias power of 25 W was applied to the silicon substrate for 5 minutes.

Referring to FIG. 10, more Si—C bonds were formed when a bias was applied to the silicon substrate in the pretreatment process of the silicon substrate (curve D) than when a bias was not applied to the silicon substrate in the pretreatment process of the silicon substrate (curve C). Accordingly, it could be understood that it is possible to increase the bonding strength between a silicon substrate and graphene by applying a bias to the silicon substrate in a pretreatment process of the silicon substrate.

Figure 11:
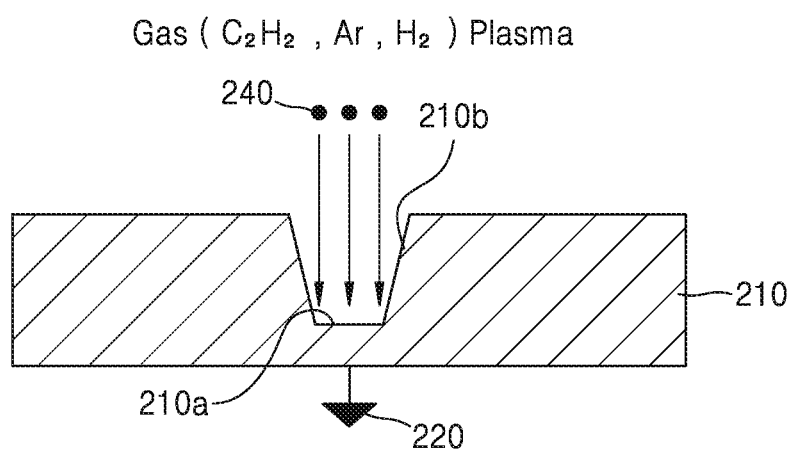
FIGS. 11 to 12 are views illustrating a method of forming graphene according to another example embodiment.
Figure 12:
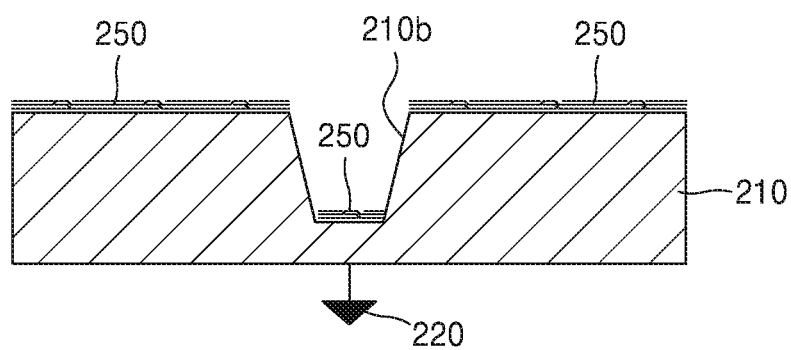

FIGS. 11 to 12 are views illustrating a method of forming graphene according to another example embodiment.

The method of forming graphene of the present embodiment includes a substrate pretreatment process and a graphene growing process. The substrate pretreatment process is the same as the substrate pretreatment process illustrated with reference to FIGS. 1 to 4B, and thus a description thereof will not be presented here. However, in the present embodiment, for example, a trench having a given shape may be formed in a substrate 210. As described above, at least one of charges and activation sites capable of inducing adsorption of activated carbon may be formed on a surface of the substrate 210 through the substrate pretreatment process.

Hereinafter, the graphene growth process performed after the substrate pretreatment process will be described with reference to FIGS. 11 and 12. FIGS. 11 and 12 illustrate operations for growing graphene 250 on the substrate 210 by PECVD. In FIGS. 11 and 12, charges and activation sites formed on the surface of the substrate 210 by the substrate pretreatment process are not shown for convenience sake.

Referring to FIG. 11, after the substrate pretreatment process, reaction gas for growing graphene 250 (refer to FIG. 12) is injected into a reaction chamber. Here, the reaction gas may include a carbon source. For example, the carbon source may include at least one of hydrocarbon gas and vapor of a liquid precursor containing carbon.

The reaction gas may further include at least one of an inert gas and hydrogen gas. For example, the inert gas may include at least one of argon gas, neon gas, nitrogen gas, helium gas, krypton gas, and xenon gas. FIG. 11 illustrates an example in which the reaction gas includes a carbon source, an inert gas, and hydrogen gas, wherein acetylene gas and argon gas are respectively used as the carbon source the inert gas.

Next, a bias is applied to the substrate 210 using a bias supply 220. The bias applied to the substrate 210 may be, for example, an RF bias or a DC bias. Here, bias power applied to the substrate 210 may be diversely varied. Accordingly, a positive (+) bias voltage or a negative (−) bias voltage may be applied to the substrate 210. Next, in a state in which the bias is applied to the substrate 210, power for generating plasma is applied to the inside of the reaction chamber from a plasma power source (not shown). For example, the plasma power supply may be an RF plasma generating device or an MW plasma generating device. Alternatively, the plasma power supply may include a plurality of RF plasma generating devices or a plurality of MW plasma generating devices.

When power for generating plasma inside the reaction chamber is applied from the plasma power supply, plasma of the reaction gas may be generated in the reaction chamber. In addition, activated carbon 240, for example, activated carbon source radicals, may be formed in the reaction chamber by the plasma of the reaction gas.

The activated carbon 240 generated by the plasma of reaction gas, that is, carbon source radicals, is adsorbed on the surface of the substrate 210. In this case, since the bias is applied to the substrate 210, the activated carbon 240 generated by the plasma of the reactive gas may move linearly toward the substrate 210. Thus, the activated carbon 240 may be attached to a selected region of the substrate 210. For example, since the activated carbon 240 moves linearly toward the substrate 210 as illustrated in FIG. 11, the activated carbon 240 may be selectively absorbed to a bottom surface 210*a* of the trench instead of being attached to slopes 210*b* of the trench.

In addition, since charges or activation sites capable of inducing adsorption of activated carbon 240 are formed on the surface of the substrate 210 by the substrate pretreatment process, the activated carbon 240 may be more effectively adsorbed on the bottom surface 210*a* of the trench.

Referring to FIG. 12, as the activated carbon 240 is continuously adsorbed on the surface of the substrate 210, for example, on the bottom surface 210*a* of the trench, graphene 250 may be selectively grown and formed on the bottom surface 210*a* of the trench.

In the graphene growth process, the processing temperature and the processing pressure of the inside of the reaction chamber may be diversely varied according to growth conditions of graphene. For example, the graphene growth process may be performed at a processing temperature of about 1000° C. or less (for example, about 700° C. or less).

As described above, since plasma of the reaction gas is generated in a state in which a bias is applied to the substrate 210 in the graphene growth process, the graphene 250 may be grown by causing the activated carbon 240 to be selectively adsorbed on a surface of the substrate 210, for example, on the bottom surface 210*a* of the trench.

Figure 13:
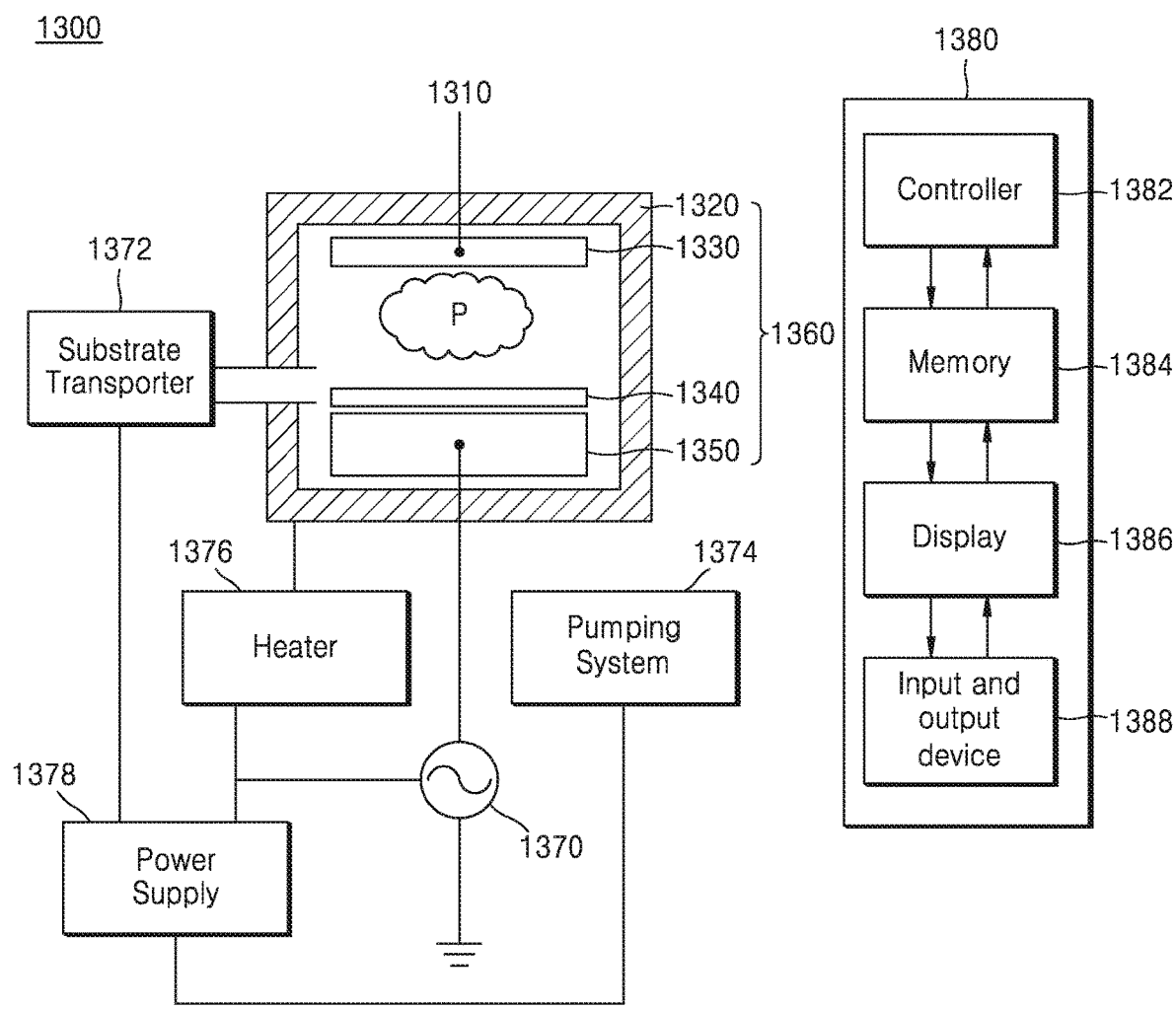
FIG. 13 is a cross-sectional view of an apparatus for forming graphene according to some example embodiments.

FIG. 13 is a cross-sectional view of an apparatus for forming graphene according to some example embodiments.

Referring to FIG. 13, an apparatus 1300 may include a gas supply 1310, a process chamber 1360, a plasma generation unit 1370, a substrate transporter 1372, a pumping system 1374, a heater 1376, a power supply 1378, and an operation station 1380. The process chamber 1360 may include a chamber housing 1320, an upper electrode 1330 in the chamber housing 1320, and a substrate support 1350 in the chamber housing 1320. The upper electrode 1330 may be connected to a gas supply 1310 with conduits and gas flow controllers for providing reaction gases into the process chamber 1360. The substrate support 1350 may be an electrostatic chuck, but is not limited thereto.

A substrate transporter 1372, such as a robot arm, may transport a substrate 1340 into and out of the process chamber 1360. The process chamber 1360 may include a gate valve that opens when the substrate transporter 1372 transports the substrate 1340 into or out of the process chamber 1360 and closes when the process chamber 1360 performs operations (e.g., vacuum processes). A heater 1376 (e.g., electric heater) may control the temperature of the substrate support 1350, inner wall of process chamber 1360, and upper electrode 1330. The plasma generation unit 1370 may be a RF power generator and may be connected to the substrate support 1350 and may be used to generate a plasma P of a reaction gas in the process chamber 1360. Alternatively, a microwave power supply may be used to generate the plasma P in the process chamber 1360. A pumping system 1374 connected to the process chamber 1360 may create a vacuum in the process chamber 1360. A power supply 1378 (e.g., circuit) may provide electrical power to the apparatus 1300.

The operation station 1380 may control operations of the apparatus 1300. The operation station 1380 may include a controller 1382, a memory 1384, a display 1386 (e.g., monitor), and an input and output device 1388. The memory 1384 may include a nonvolatile memory, such as a flash memory, a phase-change random access memory (PRAM), a magneto-resistive RAM (MRAM), a resistive RAM (Re-RAM), or a ferro-electric RAM (FRAM), and/or a volatile memory, such as a static RAM (SRAM), a dynamic RAM (DRAM), or a synchronous DRAM (SDRAM). The input and output device 1388 may be a keyboard and/or a touch screen.

The memory 1384 may store an operating system and may store recipe instructions that include settings (e.g., gas flow rates, temperature, time, power, pressure, etc.) for different manufacturing processes performed by the apparatus 1300. The memory 1384 may store recipe instructions for forming a graphene product on the substrate 1340 according to one or more of the embodiments in FIGS. 1 to 8 and/or 11 to 12 of the present application.

The controller 1382 may be, a central processing unit (CPU), a controller, or an application-specific integrated circuit (ASIC), that when, executing recipe instructions stored in the memory 1384 (for one or more of the embodiments in FIGS. 1 to 8 and/or 11 to 12) configures the controller 1382 as a special purpose controller that operates apparatus 1300 to form a graphene according to example embodiments on the substrate 1340.

As described above, according to the one or more of the above example embodiments, in the substrate pretreatment process, a bias is applied to a substrate, and plasma is used such that charges or activation sites capable of inducing adsorption of activated carbon on the surface of the substrate may be formed. Therefore, in the graphene growth process, activated carbon may be more effectively adsorbed on the surface of the substrate, and thus graphene may be grown and formed on the surface of the substrate at a relatively low temperature. Furthermore, in the graphene growth process, a bias may be applied to the substrate to selectively grow graphene on a selected surface of the substrate.

For example, when a semiconductor device including graphene that may be used as a metal barrier material is fabricated, it may be necessary to directly grow graphene on a non-catalytic substrate at a relatively low temperature of about 700° C. or less. According to the example embodiments, the substrate pretreatment process may be performed at a relatively low temperature to induce adsorption of activated carbon on the surface of the substrate, and graphene may be directly grown and formed on the pretreated surface of the substrate by PECVD. Therefore, a semiconductor device including graphene may be easily fabricated through low-temperature processes.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of forming graphene, the method comprising:
   treating a surface of a substrate placed in a reaction chamber with plasma while applying a bias to the substrate; and
   growing graphene on the surface of the substrate by plasma enhanced chemical vapor deposition (PECVD), wherein
   the treating the surface of the substrate includes forming at least one of charges and activation sites inducing adsorption of activated carbon on the surface of the substrate.

2. The method of claim 1, wherein the activation sites includes at least one of roughness and defects.

3. The method of claim 1, wherein the treating the surface of the substrate includes:
   injecting a pretreatment gas into the reaction chamber;
   applying the bias to the substrate; and
   generating the plasma in the reaction chamber while applying the bias to the substrate.

4. The method of claim 3, wherein the pretreatment gas includes at least one of an inert gas, hydrogen, oxygen, ammonia, chlorine, bromine, fluorine, and fluorocarbon.

5. The method of claim 3, wherein
   the applying the bias to the substrate includes supplying a bias power to the substrate, and
   the bias power ranges from about 1 W to about 100 W.

6. The method of claim 1, wherein the growing of the graphene includes:
   injecting a reaction gas including a carbon source into the reaction chamber; and
   directly growing the graphene on the surface of the substrate by generating plasma in the reaction chamber.

7. The method of claim 6, wherein the reaction gas further includes at least one of an inert gas and hydrogen gas.

8. The method of claim 6, wherein the treating the surface of the substrate and the growing the graphene are performed at a processing temperature of about 1000° C. or less.

9. The method of claim 6, wherein the treating of the surface of the substrate is performed at a lower processing pressure than the growing the graphene.

10. The method of claim 6, wherein the treating the surface of the substrate is performed at a processing pressure of about 0.02 torr to about 5.0 torr.

11. The method of claim 6, wherein
    the plasma used in the treating the surface of the substrate is generated by at least one of a radio frequency (RF) plasma generating device or a microwave (MW) plasma generating device, and
    the plasma used in the growing the graphene is generated by at least one of a radio frequency (RF) plasma generating device or a microwave (MW) plasma generating device.

12. The method of claim 6, wherein a plasma power in the treating the surface of the substrate is greater than a plasma power in the growing of the graphene.

13. The method of claim 6, wherein a plasma power in the treating the surface of the substrate ranges from about 10 W to about 4000 W.

14. The method of claim 6, wherein the growing of the graphene further includes applying a bias to the substrate.

15. The method of claim 1, wherein the substrate includes at least one of a group IV semiconductor material, a semiconductor compound, a metal, and an insulating material.

16. The method of claim 15, wherein the substrate further includes a dopant.

17. A method of forming graphene, the method comprising:
- treating a surface of a substrate by applying a bias to the substrate; and
- growing graphene on the surface of the substrate, wherein the treating the surface of the substrate includes forming at least one of charges and activation sites inducing adsorption of activated carbon on the surface of the substrate.

18. The method of claim 17, wherein the treating the surface of the substrate includes:
- injecting a pretreatment gas into a reaction chamber;
- applying the bias to the substrate; and
- generating plasma in the reaction chamber while applying the bias to the substrate.

19. The method of claim 17, wherein the growing the graphene includes:
- injecting a reaction gas including a carbon source into a reaction chamber; and
- directly growing the graphene on the surface of the substrate by generating plasma in the reaction chamber.

20. A method of forming graphene, the method comprising:
- preparing a substrate including a plasma-treated surface, the preparing the substrate including performing a plasma operation on the substrate while applying a bias to the substrate,
- growing graphene on the plasma-treated surface of the substrate by plasma enhanced chemical vapor deposition (PECVD), wherein
- the plasma-treated surface of the substrate includes at least one of charges and activation sites inducing adsorption of activated carbon on the plasma-treated surface of the substrate.

21. The method of claim 20, wherein the preparing the substrate includes:
- placing the substrate including the plasma-treated surface in a reaction chamber,
- injecting a pretreatment gas into the reaction chamber;
- applying the bias to the substrate; and
- generating a plasma in the reaction chamber while applying the bias to the substrate in the reaction chamber.

22. The method of claim 21, wherein
- the pretreatment gas includes at least one of an of an inert gas, hydrogen, oxygen, ammonia, chlorine, bromine, fluorine, and fluorocarbon, and
- the substrate includes at least one of a group IV semiconductor material, a semiconductor compound, a metal, and an insulating material.

23. The method of claim 20, wherein
- the preparing the substrate is performed at a processing temperature of about 1000° C. or less, a processing pressure in a range of about 0.02 torr to about 5.00 torr, a bias power in a range from about 1 W to about 100 W, and a plasma power in range from about 10 W to about 4000 W.

24. The method of claim 20, wherein the growing graphene on the plasma-treated surface of the substrate includes:
- injecting a reaction gas including a carbon source into a reaction chamber; and
- generating a plasma in the reaction chamber from the reaction gas while the substrate including the plasma-treated surface is in the reaction chamber.

* * * * *